(12) United States Patent
Hintz et al.

(10) Patent No.: US 6,276,049 B1
(45) Date of Patent: *Aug. 21, 2001

(54) METHOD FOR SETTING ELECTRICAL CHARACTERISTICS OF SENSORS AFTER ASSEMBLY

(75) Inventors: Frederick W. Hintz, Freeport; Stephen J. Postma, Pecatonica, both of IL (US)

(73) Assignee: Honeywell International INC, Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,108

(22) Filed: Oct. 6, 1998

(51) Int. Cl.[7] ................................................. H01C 17/00
(52) U.S. Cl. ............................... 29/610.1; 29/613; 29/619
(58) Field of Search .................................. 29/610.1, 611, 29/612, 621, 592.1; 338/24, 22 R, 25–30; 219/544, 546, 548, 764

(56) References Cited

U.S. PATENT DOCUMENTS

| 3,611,559 | * | 10/1971 | McKay et al. | 29/611 |
| 3,743,853 | * | 7/1973 | Dittman et al. | 307/116 |
| 4,841,157 | | 6/1989 | Downing, Jr. | |
| 5,221,916 | * | 6/1993 | Mcqueen | 338/24 |
| 5,365,768 | | 11/1994 | Suzuki et al. | |
| 5,801,530 | * | 9/1998 | Crosby et al. | 324/207 |

FOREIGN PATENT DOCUMENTS

| 2 633 081 | 12/1989 | (FR). |
| 09 210831 | 8/1997 | (JP). |
| 10 197600 | 7/1998 | (JP). |

OTHER PUBLICATIONS

Dallas Semiconductor Spec Sheet for DS/804 NV Trimmer Potentiometer, 6 pp. © 1995.
PCT International Search Report, Aug. 17, 2000, International Application No. PCT/US 99/21925.
Patent Abstracts of Japan, vol. 1997, No. 12, Dec. 25, 1997 (referring to JP 09 210831 A).
Patent Abstracts of Japan, vol. 1998, No. 12, Oct. 31, 1998 (referring to JP 10 197600 A).

* cited by examiner

*Primary Examiner*—Lee Young
*Assistant Examiner*—Sean Smith
(74) *Attorney, Agent, or Firm*—Roland W. Norris; Kevin L. Wildenstein; Andrew A. Abeyta

(57) ABSTRACT

A sensor, such as a proximity sensor, having its components sealed within a case, has its sensitivity adjusted with a remotely settable digital potentiometer after assembly of the sensor. The adjustment connection is then destroyed.

13 Claims, 3 Drawing Sheets

METHOD FOR SETTING ELECTRICAL CHARACTERISTICS OF SENSORS AFTER ASSEMBLY

BACKGROUND OF THE INVENTION

1. Field of the Invention

This invention relates generally to sensors whose sensitivity is set via a potentiometer located within the sensor casing and which is encased in a potting compound.

2. Description of the Prior Art

In the assembly of a typical proximity sensor, the operate point, or sensitivity, of the sensor is set before assembly is completed. This is done because in a typical sensor, such as a proximity sensor, the sensitivity is set manually through direct contact with the potentiometer adjustment screw. The potentiometer and associated electronics, usually contained on a PC board, are then fitted within the casing of the sensor and surrounded with a setting, or potting, compound in a liquid state which then hardens to protect the components from outside environmental influences such as shock, moisture, or the like. However, upon this potting operation, the sensitivity or operate point, of the sensor may shift from the initial set point. If the sensitivity shifts far enough so that the sensor is no longer within specifications the sensor must be scrapped. Also, because of this limitation the design and layout of the components may need to be tailored around setting the sensitivity in the middle of the assembly process. Therefore, the assembly process may require methods such as multiple fillings and automated assembly interruption for manual intervention during assembly. These steps result in more time and expense to assemble the sensor.

Therefore, it would be desirable to have a method of constructing a sensor such that the potentiometer may be potted and then set to yield the proper sensitivity for the sensor thereby yielding a smoother assembly process and less out of tolerance sensors which must be scrapped. It would further be desirable to render the set point to the potentiometer, and thus the sensor sensitivity, stable against all outside influences once the sensor is completely constructed within specifications.

SUMMARY OF THE INVENTION

In order to accomplish the above purposes it is desirable to replace a potentiometer of the direct-contact, manually adjustable type with a remotely adjustable potentiometer, whereby the adjustment means may affect the set point of the potentiometer and thus the sensitivity of the sensor, after the sensor is completely constructed with its electronic components sealed within the case, such as by overmolding, sealing in a potting compound, or encased in a snap-together casing which is not easily separated.

This may be accomplished by the substitution of a manually adjustable potentiometer with a digital potentiometer having remote adjustment means. However, because digital potentiometers may be knocked out of adjustment by having their set point affected by environmental transients, the remote adjustment line, once the proper set point has been obtained, is destroyed so that the sensor remains within specified operating parameters.

BRIEF DESCRIPTION OF THE DRAWINGS

The present invention will be more fully and completely understood from a reading of the Description of the Preferred Embodiment in conjunction with the drawings, in which.

DESCRIPTION OF THE PREFERRED EMBODIMENT

Figure 1:
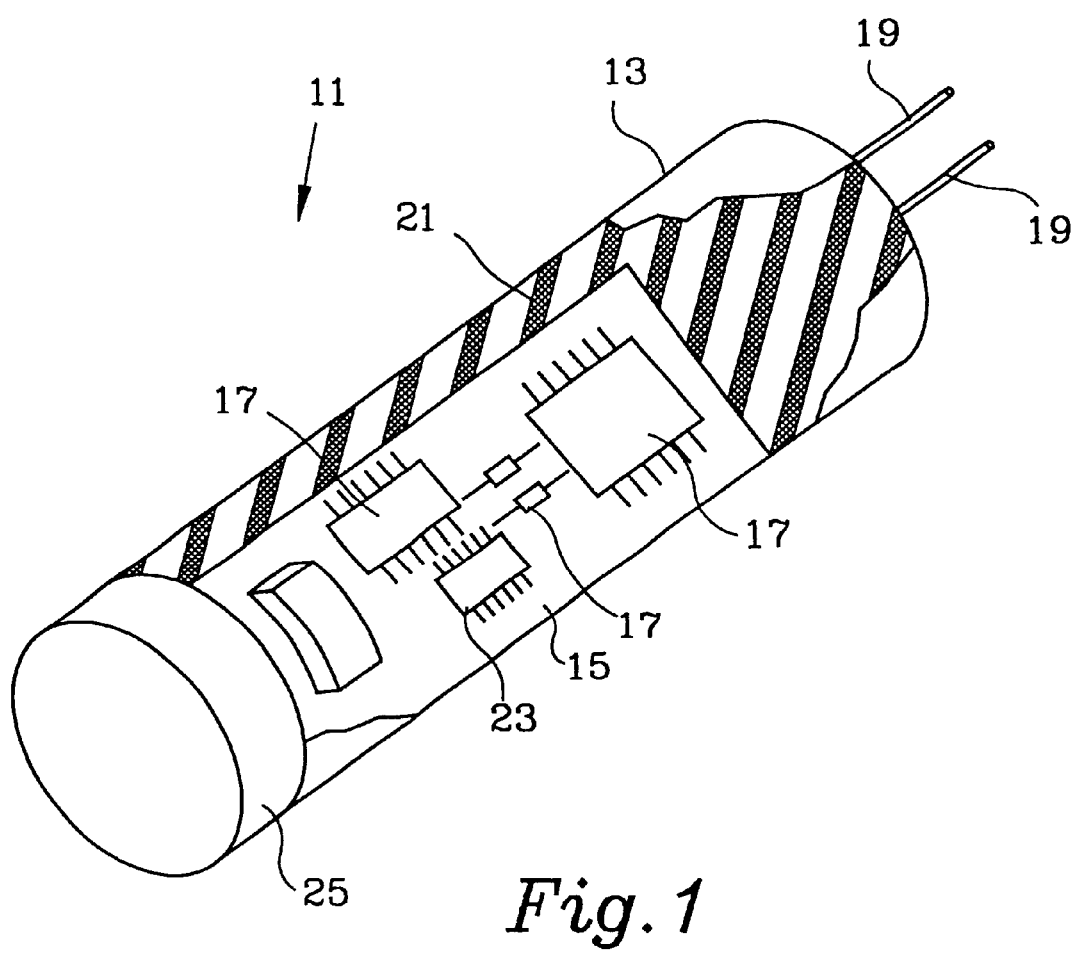
FIG. 1 is a partial cut away view of a proximity sensor according to the present invention generally detailing the environment of the present invention.

Throughout the Description of the Preferred Embodiment, like components will be identified by like reference numerals.

Referencing FIG. 1, a proximity sensor 11 is shown. While the present invention is described in the preferred embodiment with specific reference to this proximity sensor, it will be appreciated by the ordinary artisan that other sensors may like-wise benefit from the utilization of the present invention.

The proximity sensor 11 generally comprises a case 13 within which is inserted a PC board 15 to which are affixed electronic components, collectively referenced as 17. The type and amount of electrical components are not considered necessary to an exposition of the present invention beyond that detailed below. The PC board 15 is connected to electrical connectors 19 extending to the exterior of the casing 13. The PC board 15 and electrical components 17 thereon are fixed within the cast 13 during assembly, preferably by application of a fluid potting compound 21 which then hardens to prevent environmental damage to the electrical component 17. The hardened compound 21 is schematically indicated by cross hatching in FIG. 1. While the necessary components for operation of the sensing apparatus 11 will be known to the ordinarily skilled artisan, a remotely settable digital potentiometer 23 is shown in FIG. 1 for further understanding of FIGS. 2 and 3.

Preferably, during construction of the sensor 11, the potentiometer 23 will be set to zero before the PC board 15 is inserted in the case 13 so that only the increment function to set the potentiometer need be operated to set the final value of sensor sensitivity. However, the potentiometer could be set to a midpoint and incremented or decremented later as necessary. The potting compound 21, typically an epoxy, will then be applied and allowed to harden and the case 13 will be thereby sealed. Additionally one or more end caps 25 may be applied as necessary for the finished assembly. At this point an electrical connection to the digital potentiometer 23 will still exist through at least one of the plurality of electrical connectors 19. The sensor 11 is then placed in a suitable test apparatus and the potentiometer 23 is adjusted until the sensitivity of the sensor 11 is within the specification. As detailed below, the electrical connection between the remotely adjustable, or settable, digital potentiometer 23 is then severed so that the potentiometer value can not be changed accidentally or through encountering environmental transients.

Figure 2:
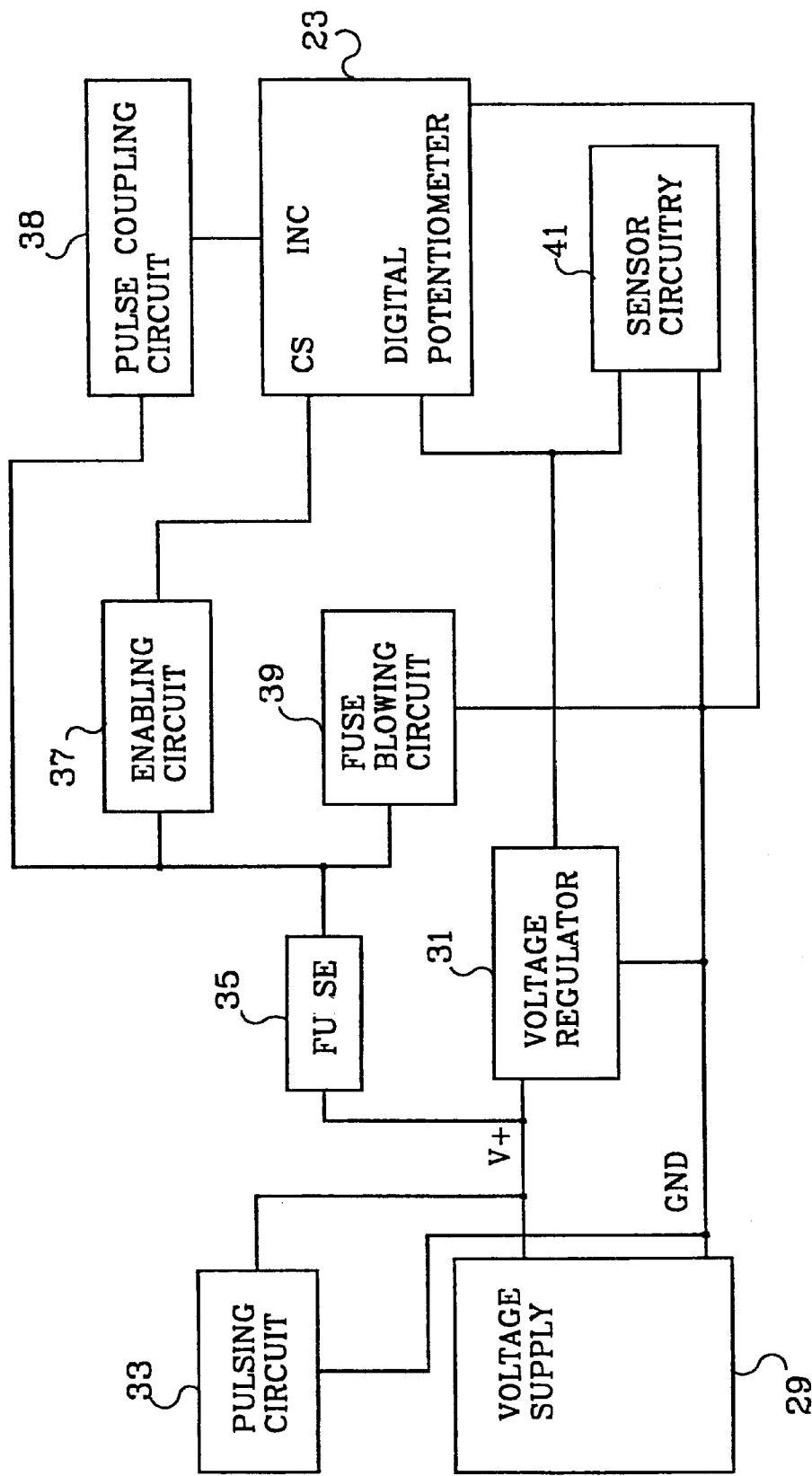
FIG. 2 is a schematic representation of the electrical components of the proximity sensor of FIG. 1.

Referencing FIG. 2, an electrical diagram for operation of the sensor 11 is shown. While the generally referenced electrical components 17 are shown in FIG. 2 as discrete boxes, this is not intended to limit the present invention to any configuration or combination of discrete components. It will be recognized that various functional groupings may be combined into one or more integrated circuits, subassemblies, or the like.

The voltage supply 29 and a pulsing circuit 33 are preferably external to the PCB 15 (FIG. 1) and connected thereto via an electrical connector such as a wire, ribbon connector, or the like extending between the electrical connectors 19 and the PCB. A voltage regulator 31, is connected to a fuse 35 which in turn is connected to an enabling circuit 37 and a pulse coupling circuit 38 both of which are connected to, and for the control of, digital potentiometer 23. The fuse 35 is further connected to a fuse blowing circuit 39 which in turn is connected between the supply voltage and ground to enable an overvoltage condition which will draw enough current to blow the fuse without harming the other sensor components.

The enabling circuit 37, and pulse coupling circuit 38 are connected to those pins necessary to implement the adjustment of the digital potentiometer 23. The digital potentiometer 23 may be of the type such as part number DS1804 available from Dallas Semiconductor Corporation or the like. Once the proximity sensor has been assembled, the potentiometer is remotely set by applying proper voltage pulses to the circuitry through external connectors 19 to adjust the potentiometer as necessary. Once the operating parameters of the proximity sensor are within the desired specification an overvoltage condition is applied to the electrical circuit of FIG. 2 causing the fuse blowing circuit 39 to increase current through the fuse 35 to sufficient to blow, or open, the fuse 35 thereby rendering the set point of the digital potentiometer fixed against accidental pulse application through accidental human intervention or environmental transients.

Figure 3:
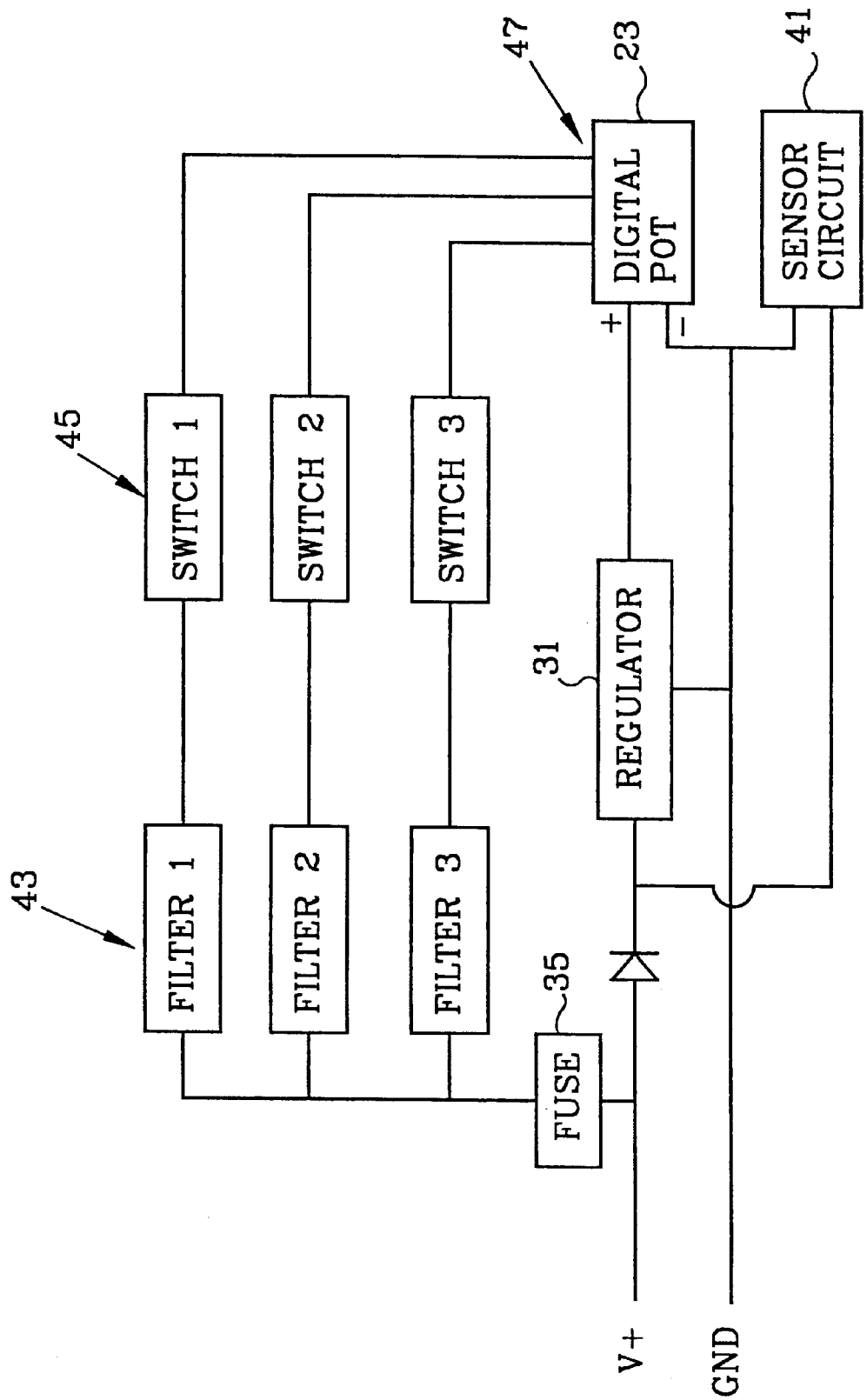
FIG. 3 is an alternative embodiment of the schematic of electrical components from FIG. 2.

As shown in the alternative embodiment of FIG. 3, the circuitry may include a plurality of filters 43 and switches 45 connected between the fuse and the digital potentiometer adjustment pins, indicated generally by 47, to further regulate and control the setting of the potentiometer set point, especially should the remote setting of the potentiometer require a modulated signal or the like. The voltage regulator 31 is indicated in position between the voltage supply 29 and both the digital potentiometer 23 and sensing circuitry 41 in order to control application of the overvoltage condition thereto when opening the fuse 35.

It will thus be appreciated that after setting the potentiometer by remote means, i.e. without resort to the direct manual adjustment of the potentiometer, the fuse 35 will be opened and the sensitivity of the sensor will be locked in to its correct state. Major benefits of this method of sensor construction include the elimination of multiple epoxy fillings steps, eliminating the need for manual intervention during automated assembly and elimination of the need for special interface wires or contacts external to the sensor. While the digital potentiometer shown has been described in terms of having a hard wire electrical connection and pulsed voltage adjustment, it will of course be appreciated that alternative embodiments such as adjustment through a modulated carrier signal or application of pulsed electromagnetic waves such as radio frequencies might also be incorporated into the setting circuitry of the digital potentiometer while retaining the desirable benefits of the present invention.

While the present invention has been described in terms of a specific embodiment, it will of course be appreciated that many variations will occur to a person have ordinary skill in the art and that the present invention may be implemented in a variety of ways and is not to be limited except by the claims herein.

What is claimed is:

1. A method of assembling a sensor comprising the steps of:
   (a) initially placing a sensing apparatus inside a casing, the sensing apparatus including a sensing circuit that has at least one electrical connector extending to the outside of the casing and a settable potentiometer for setting electrical characteristics of the sensor connected to the electrical connector;
   (b) then sealing the sensing apparatus within the casing;
   (c) then measuring the electrical characteristics of the sensing apparatus; and
   (d) finally attaching the electrical connector to electrical means capable of omitting a signal for changing the value of the settable potentiometer, and operating the means for changing as necessary to set the potentiometer to a pre-selected electrical characteristic after sealing the sensing apparatus within the casing.

2. A method of assembling a proximity sensor according to claim 1 further comprising the step of destroying the electrical connection between the outside of the sensor casing and the potentiometer.

3. A method of assembling a proximity sensor according to claim 1 wherein:
   the step of destroying the electrical connection between the potentiometer and the outside of the case includes raising current to a level sufficient to destroy the connection.

4. A method of assembling a proximity sensor according to claim 2 wherein:
   the step of destroying further comprises opening a fuse supplied in said connection.

5. A method of assembling a proximity sensor according to claim 4 wherein:
   the step of destroying the electrical connection between the potentiometer and the outside of the case includes raising a voltage or a current to a level sufficient to destroy the connection.

6. A method of assembling a proximity sensor according to claim 4 wherein the step of operating the means for changing includes selecting switches, or filters, or both, within the means for electrical connection.

7. A method of assembling a sensor having a settable sensitivity, the method comprising:
   (a) initially supplying a sensor casing;
   (b) then inserting sensing apparatus inside the casing, the sensing apparatus including a sensing circuit that has at least one electrical connector extending to the outside of the casing and a digital potentiometer for setting the sensitivity of the sensing apparatus;
   (c) then sealing the sensing apparatus within the casing;
   (d) then measuring the sensitivity of the sensing apparatus;
   (e) then attaching the electrical connector to electrical means capable of emitting a signal for changing the value of the potentiometer, and operating the means for changing as necessary to set the potentiometer to a preselected operating point of the sensor after sealing the sensing apparatus within the casing; and
   (f) finally destroying the electrical connection between the outside of the casing and the potentiometer.

8. A method of assembling a proximity sensor according to claim 7 wherein:
   the step of destroying the electrical connection between the potentiometer and the outside of the case raising voltage or current to a level sufficient to destroy the connection.

9. A method of assembling a proximity sensor according to claim 7 wherein:
   the step of destroying further comprises opening a fuse supplied in said connection.

10. A method of assembling a proximity sensor according to claim 7 further including the step of setting the potentiometer to an initial value before it is sealed in the case.

11. A method of assembling a proximity sensor according to claim 10 wherein the initial value is about zero resistance.

12. A method of assembling a proximity sensor according to claim 10 wherein the initial value is about a midpoint of the potentiometers resistance range.

13. A method of assembling a proximity sensor according to claim 10 including the step of adjusting the potentiometer to achieve a desired operating characteristic.

* * * * *